United States Patent
Feltsman et al.

(10) Patent No.: US 6,827,825 B2
(45) Date of Patent: Dec. 7, 2004

(54) METHOD FOR DETECTING THE POSITION OF A SHUTTER DISK IN A PHYSICAL VAPOR DEPOSITION CHAMBER

(75) Inventors: Michael Feltsman, San Francisco, CA (US); Allen Lau, Cupertino, CA (US); Michael Rosenstein, Sunnyvale, CA (US); Marc O. Schweitzer, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/702,230

(22) Filed: Nov. 6, 2003

(65) Prior Publication Data

US 2004/0089536 A1 May 13, 2004

Related U.S. Application Data

(62) Division of application No. 10/082,480, filed on Feb. 20, 2002, now Pat. No. 6,669,829.

(51) Int. Cl.[7] .......................... C23C 14/34; G01N 1/00
(52) U.S. Cl. ...................... 204/192.13; 427/8; 72/863; 72/863.81; 72/432.1
(58) Field of Search ............................. 73/863, 863.81, 73/432.1; 427/8; 204/192.13

(56) References Cited

U.S. PATENT DOCUMENTS

| | | |
|---|---|---|
| 4,819,167 A | 4/1989 | Cheng et al. .......... 364/167.01 |
| 5,452,521 A | 9/1995 | Niewmierzycki ............ 33/520 |
| 5,483,138 A | 1/1996 | Shmookler et al. .... 318/568.16 |
| 5,844,683 A | 12/1998 | Pavloski et al. ............ 356/399 |
| 5,917,601 A | 6/1999 | Shimazaki et al. ......... 356/375 |
| 5,980,194 A | 11/1999 | Freerks et al. .............. 414/754 |
| 6,002,840 A | 12/1999 | Hofmeister .................. 395/80 |
| 6,051,113 A | 4/2000 | Moslehi ................. 204/192.12 |
| 6,176,978 B1 | 1/2001 | Ngan ..................... 204/192.12 |
| 6,198,976 B1 | 3/2001 | Sundar et al. ................ 700/59 |
| 6,244,121 B1 | 6/2001 | Hunter ...................... 73/865.9 |
| 6,313,596 B1 | 11/2001 | Wyka et al. ................ 318/640 |

FOREIGN PATENT DOCUMENTS

JP          61084370 A  *  4/1986  .......... C23C/14/34

* cited by examiner

Primary Examiner—Steven Versteeg
(74) Attorney, Agent, or Firm—Moser, Patterson & Sheridan

(57) ABSTRACT

The present invention generally provides a physical vapor deposition chamber and a method for detecting a position of a shutter disk within a physical vapor deposition chamber. In one embodiment, a physical vapor deposition chamber includes a chamber body having a shutter disk mechanism disposed therein. A housing is sealingly coupled to a sidewall of the chamber body and communicates therewith through a slot formed through the sidewall. At least a first sensor is disposed adjacent to the housing and orientated to detect the presence of a shutter disk mechanism within the housing. In one embodiment, a method for detecting the position of a shutter disk within a physical vapor deposition chamber having a substrate support generally includes moving the shutter disk away from a substrate support, and changing a state of a first sensor in response to a position of an edge the shutter disk.

12 Claims, 4 Drawing Sheets

METHOD FOR DETECTING THE POSITION OF A SHUTTER DISK IN A PHYSICAL VAPOR DEPOSITION CHAMBER

This application is a divisional application of U.S. patent application Ser. No. 10/082,480, filed Feb. 20, 2002, now U.S. Pat. No. 6,669,829, which is hereby incorporated by reference in its entirety.

BACKGROUND OF THE INVENTION

1. Field of the Invention

Embodiments of the invention generally relate to a physical vapor deposition chamber.

2. Description of the Related Art

Many semiconductor processes are typically performed in a vacuum environment. For example, physical vapor deposition (PVD) is generally performed in a sealed chamber having a pedestal for supporting the substrate disposed thereon. The pedestal typically includes a substrate support that has electrodes disposed therein to electrostatically hold the substrate against the substrate support during processing. A target generally comprised of a material to be deposited on the substrate is supported above the substrate, typically fastened to a top of the chamber. A plasma formed from a gas, such as argon, is supplied between the substrate and the target. The target is biased, causing ions within the plasma to be accelerated toward the target. Ions impacting the target cause material to become dislodged from the target. The dislodged material is attracted toward a substrate and deposits a film of material thereon.

Generally, two conditioning operations are performed in the PVD chamber to ensure process performance. A first conditioning process is known as burning-in the target. Target burn-in generally removes oxides and other contaminants from the surface of the target and is typically performed after the chamber has been exposed to atmosphere or idled for a period of time. During the burn-in process, a utility wafer or shutter disk is disposed on the substrate support to prevent deposition of target material on the support. The burn-in process generally comprises forming a plasma within the chamber and using that plasma to remove the surface layer of material from the target.

A second conditioning process is known as pasting. Pasting generally applies a covering over material deposited on chamber components during a conventional PVD process. For example, PVD application of titanium nitride generally results in a layer of titanium nitride on the PVD chamber surfaces. The titanium nitride layer is typically brittle and may flake off during subsequent processes. Pasting generally applies a layer of titanium over the titanium nitride layer. The titanium layer substantially prevents the underlying titanium nitride from flaking or peeling. Typically, the chamber is pasted at predetermined intervals, such as after every 25 substrates are processed using a conventional titanium nitride PVD process. As with target burn-in, a shutter disk is disposed on the substrate support to prevent deposition of target material thereon during the pasting process.

Additionally, in PVD processes where titanium and titanium nitride are sequentially applied in-situ, the target requires cleaning prior to each titanium deposition to remove nitrides that be present on the target from titanium nitride deposited on the prior substrate. Generally, target cleaning is similar to a burn-in process having a few second duration and includes protecting the substrate support with a shutter disk.

After completion of each burn-in, pasting and cleaning process, the shutter disk is rotated by a robotic arm disposed within the PVD chamber to a cleared position where the shutter disk does not interfere with the deposition process within the chamber. To center the position of the shutter disk, a sensor is employed on a shaft coupled to the robotic arm to detect the rotational position of the arm.

A problem with this arrangement for detecting the position of the shutter disk in the cleared position is that the sensor does not have the capability of confirming the relative position of the shutter disk to the robotic arm. For example, misalignment between the shutter disk and the robotic arm may result in a portion of the shutter disk remaining in the path of the ceramic substrate support. As the ceramic support is elevated into a process position, a portion of the substrate may contact the shutter disk, which may result in damage to the substrate or misalignment of the substrate on the ceramic support. Moreover, if the shutter disk comes in contact with the ceramic support, the ceramic support may become chipped or damaged and necessitate replacement. Additionally, if the shutter disk is not properly aligned on the robotic arm, the disk may be misaligned relative to the ceramic support during the burn-in and pasting process, thereby resulting in unwanted deposition on a portion of the ceramic support. Deposition material on the ceramic support may lead to particular generation, scratching of the wafer and a deterioration of process performance.

Therefore, there is a need for a PVD processing chamber having an improved shutter disk sensing system.

SUMMARY OF THE INVENTION

A physical vapor deposition chamber and a method for detecting a position of a shutter disk within a physical vapor deposition chamber are generally provided. In one embodiment, a physical vapor deposition chamber includes a chamber body having a shutter disk mechanism disposed therein. A housing is sealingly coupled to a sidewall of the chamber body and communicates therewith through a slot formed through the sidewall. At least a first sensor is disposed adjacent to the housing and is orientated to detect the presence of a shutter disk mechanism within the housing.

In another embodiment, a physical vapor deposition processing chamber includes a chamber body that has a shutter blade and a substrate support disposed therein. The shutter blade is adapted to support a shutter disk and is rotatable between a first position at least partially disposed in the housing and a second position within the chamber body proximate the substrate support. A housing is sealingly coupled to a sidewall of the chamber body and communicates therewith through a slot formed through the sidewall. A first sensor is disposed proximate the housing and is orientated to detect the presence of the shutter disk viewed by the first sensor through a first window formed in the housing when the blade is in the first position.

In another aspect of the invention, a method for detecting the position of a shutter disk within a physical vapor deposition chamber having a substrate support is provided. In one embodiment, a method for detecting the position of a shutter disk within a physical vapor deposition chamber having a substrate support includes moving the shutter disk from a first position substantially concentric with the substrate support to a second position clear of the substrate support, and sensing the edge of the shutter disk in the clear position.

In another embodiment, a method for detecting the position of a shutter disk within a physical vapor deposition chamber having a substrate support includes moving the shutter disk away from the substrate support, and changing the state of a first sensor in response to a position of an edge the shutter disk.

BRIEF DESCRIPTION OF THE DRAWINGS

A more particular description of the invention, briefly summarized above, may be had by reference to the embodiments thereof, which is illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals having been used, wherever possible, to designate identical elements that are common to the figures.

DETAILED DESCRIPTION OF THE PREFERRED EMBODIMENTS

The invention generally provides a semiconductor processing system having a sensor assembly adapted to detect a cleared position of a utility wafer, such as a shutter disk. The cleared position is defined as a position where a substrate support (and substrate seated thereon) may move vertically without contacting the shutter disk or mechanisms associated with the movement of the shutter disk. Although the invention is described in a physical vapor deposition chamber, the disclosure is one of illustration, and accordingly, the invention finds utility in other semiconductor processing chambers where it is advantageous to confirm a cleared position of a utility wafer or other device which may be disposed over a substrate support between substrate processing operations.

Figure 1:
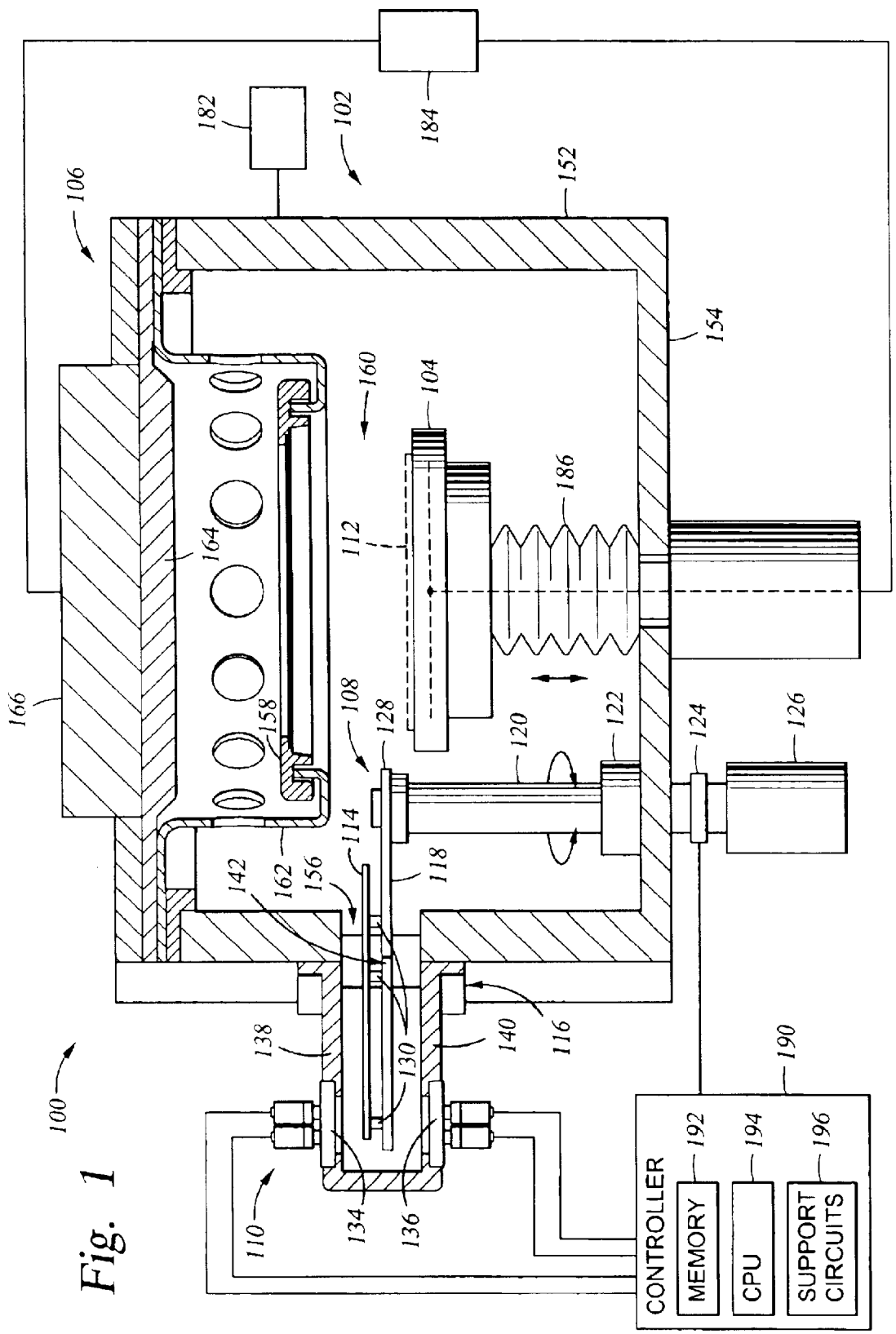
FIG. 1 depicts a semiconductor processing chamber having one embodiment of a sensor assembly adapted to detect a position of a shutter disk mechanism.

FIG. 1 depicts a semiconductor process chamber 100 that includes one embodiment of a sensor assembly 110 adapted to detect a cleared position of a utility wafer or shutter disk 114. Generally, the sensor assembly 110 is utilized to ensure that the shutter disk 114 is not in a position that would contact a substrate support 104 or a substrate 112 seated thereon during processing. One example of a process chamber 100 that may be adapted to benefit from the invention is an IMP VECTRA™ PVD process chamber, available from Applied Materials, Inc., located in Santa Clara, Calif.

The exemplary process chamber 100 includes a chamber body 102 and lid assembly 106 that define an evacuable process volume 160. The chamber body 102 is typically fabricated from a unitary block of aluminum or welded stainless steel plates. The chamber body 102 generally includes sidewalls 152 and a bottom 154. The sidewalls generally contain a plurality of apertures that include an access port, pumping port and a shutter disk port 156 (access and pumping ports not shown). The sealable access port provides for entrance and egress of the substrate 112 from the process chamber 100. The pumping port is coupled to a pumping system (also not shown) that evacuates and controls the pressure within the process volume 160. The shutter disk port 156 is configured to allow at least a portion of the shutter disk 114 therethrough when the shutter disk 114 is in the cleared position. A housing 116 generally covers the shutter disk port 156 to maintain the integrity of the vacuum within the process volume 160.

The lid assembly 156 of the body 102 generally supports an annular shield 162 suspended therefrom that supports a shadow ring 158. The shadow ring 158 is generally configured to confine deposition to a portion of the substrate 112 exposed through the center of the shadow ring 158.

The lid assembly 156 generally includes a target 164 and a magnetron 166. The target 164 provides material that is deposited on the substrate 112 during the PVD process while the magnetron 166 enhances uniform consumption of the target material during processing. The target 164 and substrate support 104 are biased relative each other by a power source 184. A gas such as argon is supplied to the process volume 160 from a gas source 182. A plasma is formed between the substrate 112 and the target 164 from the gas. Ions within the plasma are accelerated toward the target 164 and cause material to become dislodged from the target 164. The dislodged target material is attracted towards the substrate 112 and deposits a film of material thereon.

The substrate support 104 is generally disposed on the bottom 154 of the chamber body 102 and supports the substrate 112 during processing. The substrate support 104 is coupled to the bottom 154 by a lift mechanism (not shown) that is configured to move the substrate support 104 between a lower (as shown) and an upper position. The substrate support 104 is moved into the upper position for processing. In the upper position, the substrate 112 is disposed on the substrate support 104 and engages the shadow ring 158, lifting the shadow ring 158 from the shield 162.

In the lower position, the substrate support 104 is positioned below the shield 162 that allows the substrate 112 to be removed from the chamber 100 through the port in the sidewall 152 while clearing the ring 158 and shield 162. Lift pins (not shown) are selectively moved through the substrate support 104 to space the substrate 112 from the substrate support 104 to facilitate securing of the substrate 112 by a wafer transfer mechanism disposed exterior to the process chamber 100 such as a single blade robot (not shown). A bellows 186 is typically disposed between the substrate support 104 and the chamber bottom 154 and provides a flexible seal therebetween, thereby maintaining vacuum integrity of the chamber volume 160.

The substrate support 104 is typically fabricated from aluminum, stainless steel, ceramic or combinations thereof. One substrate support 104 that may be adapted to benefit from the invention is described in U.S. Pat. No. 5,507,499, issued Apr. 16, 1996 to Davenport et al., which is incorporated herein by reference in its entirety.

A shutter disk mechanism 108 is generally disposed proximate the substrate support 104. The shutter disk mechanism 108 generally includes a blade 118 that supports the shutter disk 114 and an actuator 126 coupled to the blade 118 by a shaft 120. A rotary seal 122 is disposed through the chamber bottom 154 to allow rotation of the shaft 120 without vacuum leakage from the process volume 160.

The actuator 126 generally controls the angular orientation of the blade 118. Typically, the blade 118 is moved between the cleared position shown in FIG. 1 and a second position that places the shutter disk 114 substantially concentric with the substrate support 104. In the second position, the shutter disk 114 may be transferred (by utilizing the lift pins) to the substrate support 104 during the target burn-in and chamber pasting process. Typically, the blade 118 is returned to the cleared position during the target burn-in and chamber pasting process.

The actuator 126 may be any device that may be adapted to rotate the shaft 120 through an angle that moves the blade 118 between the cleared and second positions. The actuator 126 may be an electric, hydraulic or air motor, a pneumatic or hydraulic cylinder, or a solenoid among other motion devices. The actuator 126 may include a shaft sensor 124 that detects when the shaft 120 is rotated to the second position. The shaft sensor 124 may be directly coupled to the actuator 126, as with a rotary encoder or limit switch, or may interface with the shaft 120, as with a limit switch. Other sensors 124 that may be adapted to detect the angular position of the shaft 120 may also be utilized.

The blade 118 generally supports the shutter disk 114 in a horizontal orientation. The blade 118 typically has a flat body 142 that includes a hub 128 that is coupled to the shaft 120, and at least three disk support pins 130 extending therefrom. The pins 130 generally support the shutter disk 114 in a spaced-apart relation to the blade 118. The blade 118 is configured to allow rotation of the blade 118 from the second position to the cleared position without contacting the lift pins extending from the blade 118. The blade 118 additionally includes a tab 220 (shown in FIG. 2A) that extends beyond the perimeter of the shutter disk 114.

A portion of the shutter disk 114 is disposed in the housing 116 when in the cleared position. The housing 116 is typically fabricated from the same material as the chamber body 102. The housing 116 is sealingly fastened to the chamber body 102, and in one embodiment, is continuously welded at the interface between the housing 116 and body 102 to ensure a vacuum-tight joint.

The housing 116 generally includes at least a first window 134 sealingly disposed through the housing 116. The first window 134 is positioned to allow the sensor assembly 110 to detect the presence of the shutter disk 114 and/or the blade 118 within the housing 116. In the embodiment depicted in FIG. 1, the housing 116 additionally includes a second window 136 formed in a bottom section 140 of the housing 116 opposite the first window 134 that is formed in a top section 138 of the housing 116. The windows 134, 136 are fabricated from a material substantially transparent or non-invasive to the detection mechanism of the sensor assembly 110, for example, quartz.

The sensor assembly 110 is generally disposed proximate the housing 116. The sensor assembly 110 generally includes at least one sensor that is adapted to detect the presence of the blade 118 and/or shutter disk 114 within the housing 116, preferably when in the cleared position.

The sensor assembly 110 is coupled to a controller 190 that interfaces with and typically controls the processing system 100. The controller 190 typically comprises a central processing unit (CPU) 194, support circuits 196 and memory 192. The CPU 194 may be one of any form of computer processor that can be used in an industrial setting for controlling various chambers and sub-processors. The memory 192 is coupled to the CPU 194. The memory 192, or computer-readable medium, may be one or more of readily available memory such as random access memory (RAM), read only memory (ROM), floppy disk, hard disk, or any other form of digital storage, local or remote. The support circuits 196 are coupled to the CPU 194 for supporting the processor in a conventional manner. These circuits include cache, power supplies, clock circuits, input/output circuitry, subsystems, and the like. The sensors, at least including one of the sensor assembly 110 and the shaft sensor 124, provide information to the controller 190 regarding the position of the shutter disk 114 and/or the blade 118.

Figure 2A:
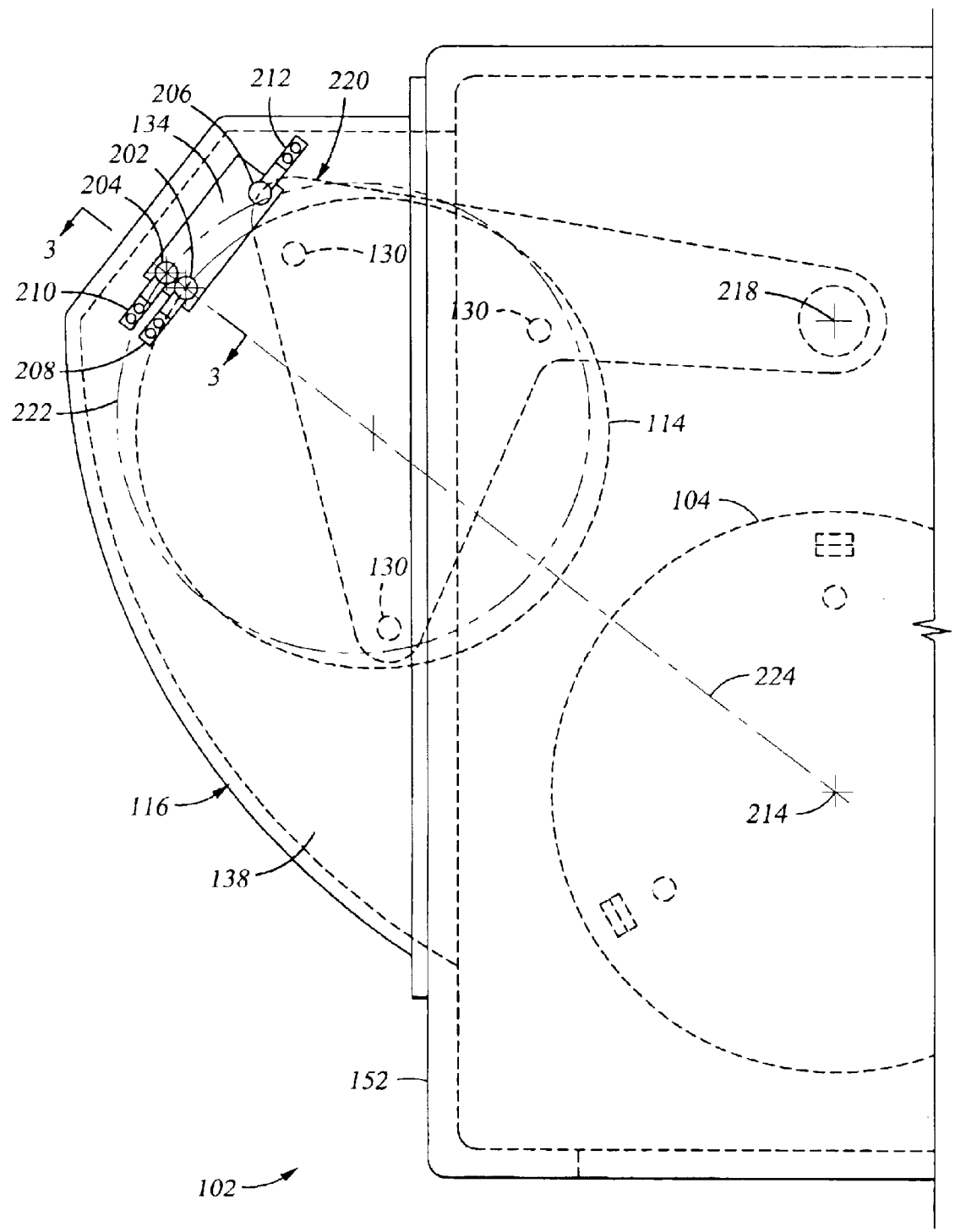
FIGS. 2A–B are sectional and plan views of a portion of the process chamber of FIG. 1.
Figure 2B:
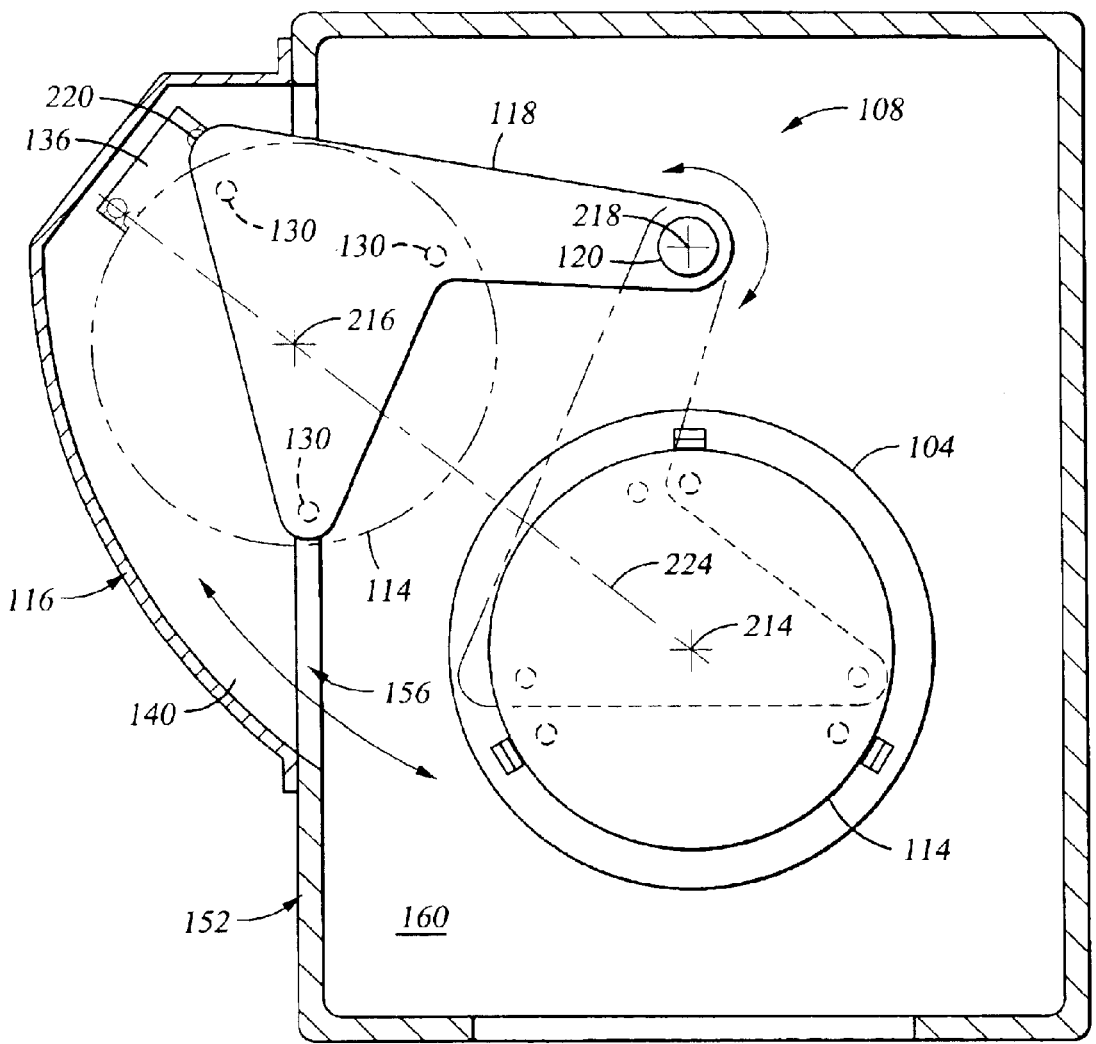

FIGS. 2A–B depict top and sectional plan views of the housing 116 illustrating one embodiment of the sensor assembly's position relative to the shutter disk 114, the blade 118 and the substrate support 104. The reader is encouraged to refer to both 2A–2B simultaneously.

In the embodiment depicted in FIGS. 2A–B, the sensor assembly includes a first sensor 202, a second sensor 204 and a third sensor 206. The sensors 202, 204 and 206 are respectfully coupled to the top 134 of the housing 116 by brackets 208, 210 and 212. The sensors 202, 204 and 206 generally provide a signal indicative of the presence of the shutter disk 114 and/or blade 118 thereunder.

The first and second sensors 202, 204 typically are positioned on a line 224 defined between a center point 214 of the substrate support 104 and reference point 216. The reference point 216 is generally located at the center of the shutter disk 114 when the shutter disk 114 is in the clear position (as shown). In one embodiment, the center and reference points 214, 216 are also equidistant from a central axis 218 of the shaft 120. The position of the sensors 202, 204 along the line 224 allows the sensors to provide a reliable indication that the shutter disk 114 is clear of the substrate support 104 as the line 224 lies along the shortest distance between the shutter disk 114 (when positioned correctly on the blade 118) and the substrate support 104.

The first sensor 202 generally detects the position of the shutter disk 114 when in the cleared position. The second sensor generally detects the shutter disk 222 when the disk is mis-positioned on the blade 118 but still detected by the first sensor 202 as shown by phantom shutter disk 222. For example, the shutter disk 222 may be positioned off-centered on the blade 118, which places the disk 222 further into the housing 116. Although the off-center position of the shutter disk 222 will still enable the substrate support to be moved vertically without contacting the shutter disk 222, the shutter disk 222 will be misaligned with the substrate support 104 when rotated to the second position for pasting or target burn-in, which will allow material to be disadvantageously deposited on the substrate support 104. Thus, the second sensor 204 indicates shutter disk 114 misalignment to the controller 190 which signals the operator or stops the production sequence is an appropriate point for service.

The third sensor 206 is generally positioned to view a portion or tab 220 of the blade 118 to indicate that the blade 118 is in the cleared position. The tab 220 of the blade 118 may be covered by the shutter disk 114 or extend beyond the shutter disk 114 to allow detection of the blade 118 when the disk 114 is also in the cleared position. Alternatively, the third sensor 206 may be positioned to view the substrate through the second window 134 or other window disposed in the housing 116.

Figure 3:
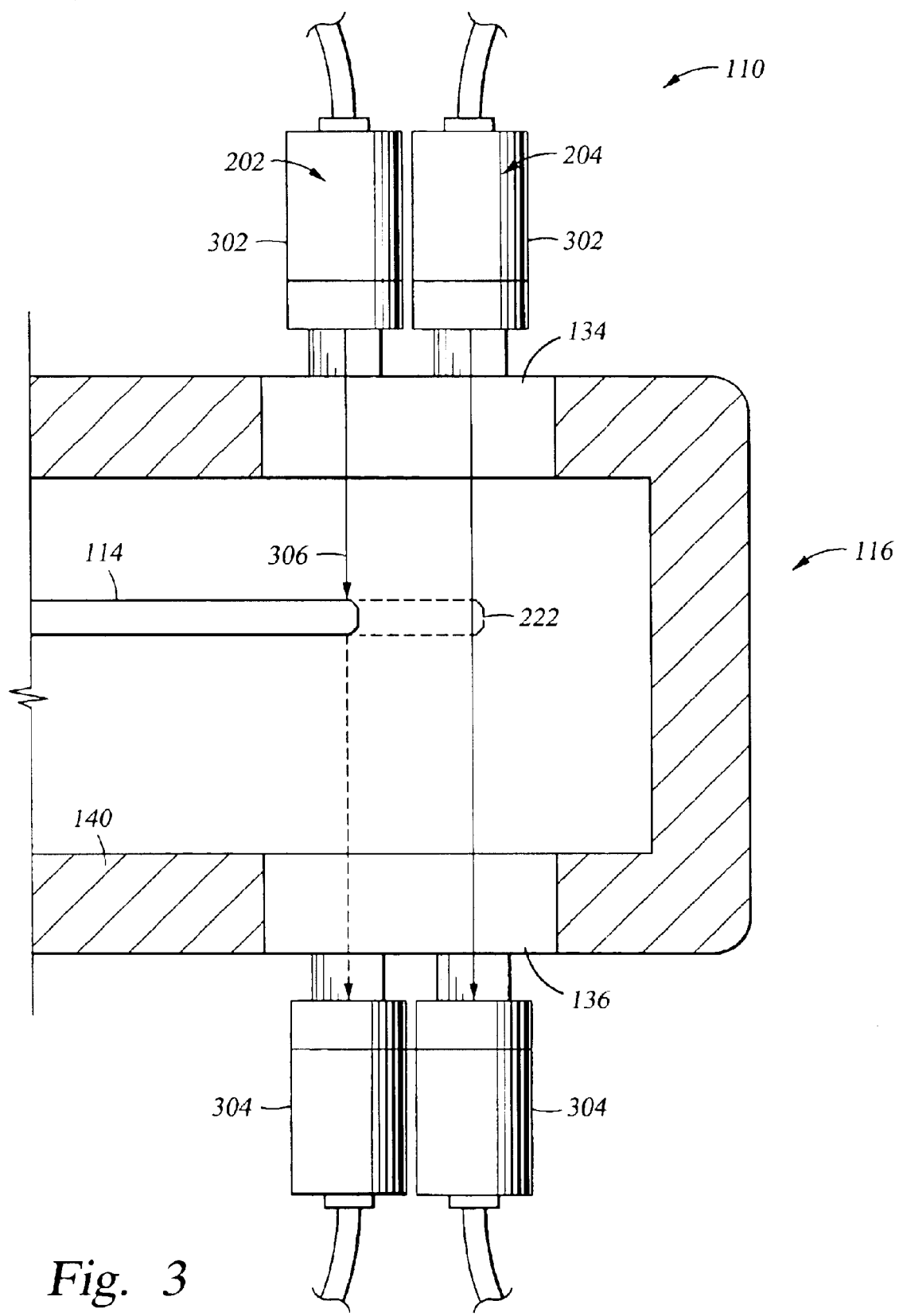
FIG. 3 depicts a sectional view of the sensor assembly taken along section line 3—3 of FIG. 2A.

FIG. 3 depicts a sectional view of one embodiment of the sensors 202, 204 taken along section line 3—3 in FIG. 2A. The sensors 202, 204 generally include an emitter 302 and a receiver 304. The emitter 302 generates a signal, such as a light beam 306, that passes through the windows 134, 136 and impinges upon the receiver 304. When the shutter disk 114 blocks or interrupts the beam 306, the sensors 202, 204 change state to indicate the presence of the shutter disk 114. Examples of sensors 202, 204 that may be utilized to detect the shutter disk 114 are available Banner Engineering Corporation, located in Minneapolis, Minn. Other types of sensors, including reflective sensors (i.e., a device having the emitter and receiver configured into a single unit) may alternatively be utilized. The third sensor 206 is similarly configured to detect the presence of the blade 118.

While the foregoing is directed to the preferred embodiment of the present invention, other and further embodiments of the invention may be devised without departing from the basic scope thereof, and the scope thereof is determined by the claims that follow.

What is claimed is:

1. A method for detecting the position of a shutter disk within a physical vapor deposition chamber having a substrate support, comprising:

moving the shutter disk from a first position substantially concentric with the substrate support to a second position clear of the substrate support; and sensing the edge of the shutter disk in the clear position.

2. The method of claim 1, wherein the step of sensing the edge of the shutter disk in the clear position further comprises:

viewing the shutter disk through a window formed in a housing coupled to the chamber.

3. The method of claim 1, wherein the step of sensing the edge of the shutter disk in the clear position further comprises:

interrupting a beam generated by an emitter and passing through a window formed in a housing coupled to the chamber.

4. The method of claim 1, wherein the step of sensing the edge of the shutter disk in the clear position further comprises:

sensing the edge of the shutter disk at a first radial distance from the shutter disk; and sensing the edge of the shutter disk at a second radial distance from the shutter disk.

5. The method of claim 4, wherein the step of sensing the edge of the shutter disk at the first radial distance from the shutter disk occurs before the step of sensing the edge of the shutter disk at the second radial distance from the shutter disk.

6. The method of claim 4, wherein the step of sensing the edge of the shutter disk at the second radial distance occurs when the shutter disk is misaligned on the shutter blade.

7. The method of claim 1 further comprising:

moving the shutter disk to the first position;

transferring the shutter disk from a shutter blade to the substrate support;

moving the shutter blade at least partially into the housing; and sensing the presence of the blade within the housing through a window disposed in the housing.

8. A method for detecting the position of a shutter disk within a physical vapor deposition chamber having a substrate support, comprising:

moving the shutter disk away from the substrate support; and changing a state of a first sensor in response to a position of an edge the shutter disk.

9. The method of claim 8, wherein the step of changing the state of the first sensor further comprises:

interrupting a beam emitted by the first sensor.

10. The method of claim 8 further comprising:

changing a state of a second sensor with an edge the shutter disk.

11. The method of claim 10, wherein the step of changing the state of the second sensor further comprises:

interrupting a beam emitted by the second sensor.

12. The method of claim 10, wherein the step of changing the state of the second sensor occurs when the shutter disk is misaligned to one side of a shutter blade supporting the shutter disk.

* * * * *